United States Patent [19]

Shyu

[11] Patent Number: 5,077,136

[45] Date of Patent: Dec. 31, 1991

[54] DIFFUSION BARRIER FOR SOLVENTS AND INORGANIC CATIONS ON POLYIMIDE SURFACES BY AMMONIA TREATMENT

[75] Inventor: Jieh-Hwa Shyu, Windham, N.H.

[73] Assignee: Digital Equipment Corp., Maynard, Mass.

[21] Appl. No.: 406,648

[22] Filed: Sep. 13, 1989

[51] Int. Cl.$^5$ .............................................. B32B 27/14
[52] U.S. Cl. ................................... 428/473.5; 427/96; 427/430.1; 428/626; 428/901; 428/911
[58] Field of Search ...................... 428/473.5, 901, 911, 428/76, 626; 427/430.1, 155, 96, ; 174/255, 256, 258; 156/668, 656, 79.1

[56] References Cited

U.S. PATENT DOCUMENTS 4,482,577 11/1984 Goldstein et al. ............... 427/430.1

Primary Examiner—Merrell C. Cashion, Jr.
Assistant Examiner—D. S. Nakarani
Attorney, Agent, or Firm—Cesari and McKenna

[57] ABSTRACT

A method of inhibiting diffusion into a polyimide body by organic solvents and cations comprising applying ammonia to one or more surfaces of the body prior to exposing the surface to the solvents and cations. A composite article incorporating the diffusion barrier is also disclosed.

12 Claims, No Drawings

DIFFUSION BARRIER FOR SOLVENTS AND INORGANIC CATIONS ON POLYIMIDE SURFACES BY AMMONIA TREATMENT

This invention relates to the protection of polyimide surfaces from organic solvents and inorganic cations. It relates more particularly to a method of creating a diffusion barrier against different molecular or ionic species by ammonia treatment of the polyimide.

BACKGROUND OF THE INVENTION

Polyimide, or more specifically aromatic poly (etherimide), such as poly (4, 4' oxydiphenylenepyromellitimide) sold under the brand name Kapton, is used widely in electronic and microelectronic fabrication because of its high temperature stability and low dielectric constant. This material, in the form of a film or tape, is used, for example, as the substrates of lead frames or so-called TAB tapes in IC chip packaging as well as the substrates of flexible printed circuits of more general application. The lead frames and circuits are metal-polyimide composites or laminates with the metal being adhered to the substrate or, more preferably, applied directly to the substrate by known sputtering or electroless or electrolytic plating processes as described, for example, in U.S. Pat. No. 4,832,799. The metal which ultimately forms the conductive traces or paths of the lead frame or circuit is usually copper, although there may be an intermediate layer of cobalt or nickel between the copper and the substrate to optimize the bond between the metal and the substrate.

Polyimide has a disadvantage, however, in that it is very permeable to organic solvents and inorganic cations. Accordingly, when the processing of the polyimide based article to its finished form requires exposure to such solvents and ions, the solvents and ions tend to diffuse into and contaminate the polyimide. In many instances, such contamination can degrade the finished article and affect the longterm reliability of that article.

For example, in the manufacture of a lead frame or flexible circuit from a metal-polyimide composite or laminate by a subtractive process, a layer of photoresist is applied to the metal layer and photoimaged through a mask corresponding to the conductive pattern to be formed on the lead frame or circuit. The composite is then subjected to a solvent bath which removes the photoresist except in those areas which received no light corresponding to the desired conductor paths. The thus imaged metal-polyimide composite is then subjected to an etching solution which etches away the unmasked metal thereby forming the lead frame or circuit. Finally, the lead frame or circuit is exposed to another solvent which strips the masking photoresist from the surfaces of the metal conductors. In a similar manner, using known additive processes, metal can be controllably plated onto the substrate to form the conductor pattern.

A commonly used photoresist solvent or wash in the fabrication of lead frames and printed circuits is methylene chloride. However, when that wash is applied to a polyimide substrate, it diffuses into the polyimide. In the presence of moisture and oxygen, e.g. moist air, the methylene chloride in the polyimide can oxidize to hydrochloric acid. That acid can, in turn, cause local corrosion of the metal conductors at the metal-polyimide interface. Such corrosion can result in eventual failure of the circuit, e.g. a short, due to the electrochemical migration of the corrosion products. Extreme corrosion can cause complete delamination of conductor segments from the substrate. Worse still, the effects of such corrosion may not manifest themselves for some time. Such corrosion can be accelerated by a high temperature bake of the circuit for an extended time and the circuit inspected for corrosion. However, this procedure is both costly and time consuming. Further, that inspection bake can itself degrade the strength of the metal-polyimide bond and adversely effect the long term reliability of the lead frame or circuit being inspected.

Contamination of the polyimide can also occur when plating the conductors of such a lead frame or printed circuit. That is, in some instances, the specifications call for a layer of metal such as gold, gold alloy or nickel to be plated onto the copper conductors of the lead frame or circuit. This requires immersion of the circuit in a plating solution which usually contains ions of an alkali metal such as cesium, potassium or sodium to increase the conductivity of the solution. These ions, or more accurately cations, tend to diffuse into the polyimide. During the plating step, electric current flows through the polyimide substrate as well as the copper layer causing electrochemical reduction of the polyimide which results in degradation of the adhesion strength of the bond between the metal conductors and the polyimide substrate.

This problem of solvent and cation contamination of polyimide can be alleviated or avoided by applying a protective coating to the surface of the polyimide thereby isolating the polyimide when those contaminants are encountered during fabrication of a lead frame, printed circuit or other polyimide-based article. However, such coatings are cumbersome and they complicate the fabrication process because the coating first has to be applied to and then removed from the polyimide at particular stages of the process.

SUMMARY OF THE INVENTION

In accordance with this invention, a metal-polyimide composite, lead frame, printed circuit or other polyimide-based article is protected against contamination by organic solvents and inorganic cations by applying liquid ammonia to the endangered surfaces of the polyimide by coating or immersion prior to exposing those polyimide surfaces to such solvents and cations.

It is known that ammonia has a tendency to interact chemically with polyimide at room temperature in the following manner:

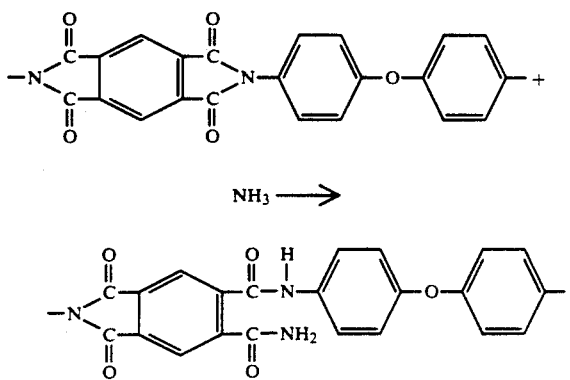

Apparently, this reaction causes the diffusion coefficient of ammonia in polyimide to be at least 2 to 3 orders of magnitude smaller than those of other molecules such as water and oxygen.

I have discovered, however, that the application of ammonia to the surface of the polyimide creates a barrier at that surface against the diffusion into the polyimide of molecular and ionic species that are completely different from ammonia, namely, organic solvents such as methylene chloride and ions of alkali metals such as cesium, potassium and sodium. While the creation of the surface diffusion barrier is not entirely understood, it is supposed that the reaction of the ammonia and the polyimide described above produces a polymer which is more diffusion resistant. In any event, I have found that the application of ammonia to the surface of the polyimide body can provide an effective and efficient way to minimize degradation of polyimide-based articles such as metal-polyimide composites or laminates, lead frames and flexible printed circuits due to diffusion of such solvents and cations into the polyimide during the fabrication of those articles.

Thus as applied to lead frame and printed circuit manufacture, this invention should materially reduce the incidence of metal corrosion at the metal-polyimide interface caused by diffusion into the polyimide of contaminants such as methylene chloride. It should also reduce the migration rate of cations into the polyimide in the presence of an electric field during the plating of such articles thereby inhibiting electrochemical reduction of the polyimide and resultant weakening of the metal-polyimide bond. Both of these effects should materially increase the long term reliability of those polyimide-based articles.

The providing of the diffusion barrier as aforesaid is not only useful during the fabrication of polyimide-based articles, the barrier may be formed in the finished article to protect the exposed polyimide surfaces of the article during the service life of the article. If for any reason the diffusion barrier has to be removed from the polyimide, this can be accomplished by acid treatment of the polyimide.

SPECIFIC DESCRIPTION

The providing of a diffusion barrier in the surfaces of a polyimide-based article such as a metal-polyimide composite, lead frame, flexible circuit or the like may be accomplished by applying ammonia to those surfaces prior to exposing the article to organic, solvents or inorganic cations.

Although gaseous ammonia could be used, it is more practical to apply liquid aqua ammonia (i.e. ammonium hydroxide ($NH_4OH$) in water) to those surfaces. In tests, ammonium hydroxide percentages of from 15% to 100% have been found to be effective. Preferably, a solution comprising about 20% to about 60% $NH_4OH$ is used. At the preferred concentration immersion of the polyimide-based body in the solution for about five minutes has produced favorable results.

The following working examples illustrate the efficacy of the invention:

COMPARATIVE EXAMPLE 1

(Without ammonia treatment)

The test sample, a 0.2 mil copper and 2 mil Kapton brand polyimide tape composite was immersed in a solution consisting of 90% methylene chloride and 10% methanol for a period of 5 minutes. Then, the sample was blow-dried with compressed air and baked in an air-vented oven maintained at a temperature of 230 C for one hour. The test sample was then removed from the oven and cooled to room temperature. Observation of the sample under an optical microscope revealed massive corrosion at the metal-polyimide interface.

EXAMPLE 2

(With ammonia treatment)

The test sample, a 0.2 mil and 2 mil Kapton brand polyimide tape composite was immersed in liquid ammonia (30% ammonium hydroxide) for 10 minutes. The treated sample was then rinsed with fresh water and air dried. Next, sample was immersed in a solution consisting of 90% methyline chloride and 10% methanol for five minutes. Then, the treated sample was blow-dried with compressed air and baked in an air-vented oven at 230° C. for one hour. Examination of the treated sample under an optical microscope revealed very little corrosion at the metal-polyimide interface.

COMPARATIVE EXAMPLE 3

(No ammonia treatment)

The test sample, a TAB tape (copper on Kapton brand polyimide tape without gold plating) was immersed in an ACR407 gold plating solution maintained at 70° C. to gold plate the copper conductors. The plating apparatus utilized platinized titanium as the anode and included a saturated Calomel reference electrode, the voltage with respect to the reference-electrode being −800 mV. Upon removal of the sample from the plating solution, a color change of the polyimide at the polyimide-metal interface was observed indicating diffusion of potassium ions from the plating solution into the polyimide. The sample was then heated in boiling water for 20 minutes. After that time, severe degradation of the peel strength of the metal to the Kapton substrate was observed.

EXAMPLE 4

(With ammonia treatment)

A test sample, identical to the sample in Example 3, was immersed in liquid ammonia (30% ammonium hydroxide) for 15 minutes. The sample was then rinsed with water and air dried. Gold metal was then plated onto the copper conductors of the treated sample using the same equipment under the same conditions described in Comparative Example 3. After plating, no color change of the polyimide polymide-metal interface was observed. The treated sample was then heated in boiling water for 20 minutes. After that time, less degradation of peel strength was observed than was the case in Comparative Example 3.

It will thus be seen that the objects set forth above, among those made apparent from the preceding description are efficiently obtained and, since certain changes may be made in carrying out the above method and in the construction set forth without departing from the scope of the invention, it is intended that all matter contained in the above description shall be interpreted as illustrative and not in a limiting sense.

It also to be understood that the following claims are intended to cover all of the generic and specific features of the invention described herein.

I claim:

1. A method of providing a diffusion barrier to a metal-polyimide composite article for protection against organic solvents and inorganic cations comprising the steps of: providing a metal-polyimide composite; applying ammonia to the exposed surfaces of the polyimide component of the composite.

2. The method of claim 1 wherein said ammonia is liquid ammonia.

3. The method of claim 2 wherein said liquid ammonia is applied to said composite by immersion.

4. The method of claim 2 wherein said liquid ammonia comprises 15 to 100% ammonium hydroxide.

5. The method of claim 4 wherein said liquid ammonia is applied to said composite by immersing for at least 5 minutes.

6. The method of claim 4 wherein, said liquid ammonia is aqueous ammonia comprising ammonium hydroxide from about 15% to about 100%.

7. The method of claim 5 wherein said ammonium hydroxide is about 20% to about 60%.

8. An article comprising a polyimide or a metal-polyimide composite and an organic solvent or cation diffusion barrier at one or more surfaces of the polyimide or composite formed by applying ammonia to said one or more surfaces.

9. The article of claim 8, wherein said polyimide is poly (4, 4' oxydiphenylene pyromellitimide).

10. The article of claim 8 wherein said composite is a lead frame or a printed circuit.

11. An article made by the method of claim 6.

12. An article made by the method of claim 7.

* * * * *